United States Patent
Hsiung et al.

(10) Patent No.: US 6,897,081 B2
(45) Date of Patent: May 24, 2005

(54) METHOD FOR FABRICATING A MONOLITHIC CHIP INCLUDING PH, TEMPERATURE AND PHOTO-INTENSITY MULTI-SENSORS AND A READOUT CIRCUIT

(75) Inventors: Stephen S. K. Hsiung, Taoyuan (TW); Jung-Chuan Chou, Yunlin (TW); Tai-Ping Sun, Taoyuan (TW); Wen-Yaw Chung, Taoyuan (TW); Yuan-Lung Chin, Taipei (TW); Chung-We Pan, Pingtung (TW)

(73) Assignee: Chung Yuan Christian University, Chung-Li (TW)

( * ) Notice: Subject to any disclaimer, the term of this patent is extended or adjusted under 35 U.S.C. 154(b) by 316 days.

(21) Appl. No.: 10/348,950

(22) Filed: Jan. 23, 2003

(65) Prior Publication Data

US 2004/0077116 A1 Apr. 22, 2004

(51) Int. Cl.[7] .................... H01L 21/00; H01L 21/8238
(52) U.S. Cl. ......................... 438/48; 438/199
(58) Field of Search .................... 438/48, 199

(56) References Cited

U.S. PATENT DOCUMENTS

| | | | |
|---|---|---|---|
| 5,607,566 A | * | 3/1997 | Brown et al. ............... 257/414 |
| 6,329,139 B1 | * | 12/2001 | Nova et al. ..................... 435/6 |
| 6,531,752 B2 | * | 3/2003 | Yaung et al. ............... 257/465 |
| 2002/0130069 A1 | * | 9/2002 | Moskoff ....................... 210/85 |
| 2003/0047752 A1 | * | 3/2003 | Campbell et al. ........... 257/186 |

* cited by examiner

Primary Examiner—Matthew Smith
Assistant Examiner—Chuong Anh Luu
(74) Attorney, Agent, or Firm—Birch, Stewart, Kolasch & Birch, LLP (57) ABSTRACT

A method for fabricating a monolithic chip including multi-sensors that can detect pH, temperature, photo-intensity simultaneously and a readout circuit. As such, as well as the multi-sensors, the readout circuit also has a reduced chip area at low cost since selection switches are used to sequentially read pH, temperature and photo-intensity detecting values, wherein the readout action is completed within a clock cycle. The entire structure is fabricated with standard 0.5 μm CMOS IC, Double Poly Double Metal (DPDM), n-well technology and allows the integration of the on-chip signal conditioning circuitry. The chip fabricated by the method can not only sense the Ph, temperature, photo values but also apply the extended gate field effect transistor (EGFET) on the temperature and light compensation to produce realistic pH values.

7 Claims, 13 Drawing Sheets

FIG. 20

METHOD FOR FABRICATING A MONOLITHIC CHIP INCLUDING PH, TEMPERATURE AND PHOTO-INTENSITY MULTI-SENSORS AND A READOUT CIRCUIT

This nonprovisional application claims priority under 35 U.S.C. § 119(a) on Patent Application No. 91124266 filed in TAIWAN, R.O.C. on Oct. 21, 2002, which is herein incorporated by reference.

BACKGROUND OF THE INVENTION

1. Field of the Invention

The invention relates to a method for layout of a monolithic chip with multi-sensors, and in particular, to a method for fabricating a monolithic chip with multi-sensors and readout circuit using standard IC process. The chip is capable of sensing pH, temperature and photo-intensity simultaneously. Additionally, the invention can achieve the objects of mass production, high yield and low cost, without additional process but the standard process.

2. Description of the Related Art

A glass electrode is typically used as an ion-sensing electrode. However, the glass electrode has the disadvantages of non-miniaturizable measurement, easy damage and portable inconvenience. Piet Bergveld introduced an ion sensitive field effect transistor (ISFET) in 1970. The ISFET has the advantages of providing pH measurement, compatible with the standard CMOS process, high input impedance and low output impedance, miniaturization for a minute solution measurement, and fast response. Therefore, the ISFET has been widely studied and applied in pH sensor miniaturization and biomedicine fields.

However, existing measurements for ISFET pH sensors have found that temperature and environment light could affect ISFETs in practical applications due to the open-gate design.

SUMMARY OF THE INVENTION

Accordingly, an object of the present invention is to provide a method for fabricating a monolithic chip including multi-sensors that can detect pH, temperature, photo-intensity simultaneously and a readout circuit using the IC standard process, so as to obtain mass production, high yield, and low cost without additional process.

The present invention provides a method for fabricating a monolithic chip including multi-sensors that can detect pH, temperature, photo-intensity simultaneously and a readout circuit using the standard IC process. The method uses the IC standard process to sequentially layout the monolithic chip in horizontal direction as below. First, an ISFET with an extended gate sensitive window is formed and an $SnO_2$ sensitive membrane is coated on the window using sputtering process, so as to form an extended gate field effect transistor (EGFET) as an ion sensitive sensor (pH sensor). Second, a metal oxide semiconductor field effect transistor (MOSFET) is formed, wherein an integrated readout circuit with selective switches is implemented to sequentially output values sensed by the multi-sensors. Using the ion implanting process, an N-type well is formed over a P-type substrate and then a p-diffusion diffusion region is formed within the N-type well. Thus, a temperature diode consisting of the p-diffusion region with respect to the N-type well is formed such that the temperature diode acts as a temperature sensor to sense temperature in forward bias voltage. Using the ion implanting process, an n-diffusion region is formed within the P-type substrate such that a photodiode consisting of the n-diffusion region with respect to the P-type substrate is produced and acts as a photo-sensor to sense photo-intensity in reverse bias voltage.

DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1:
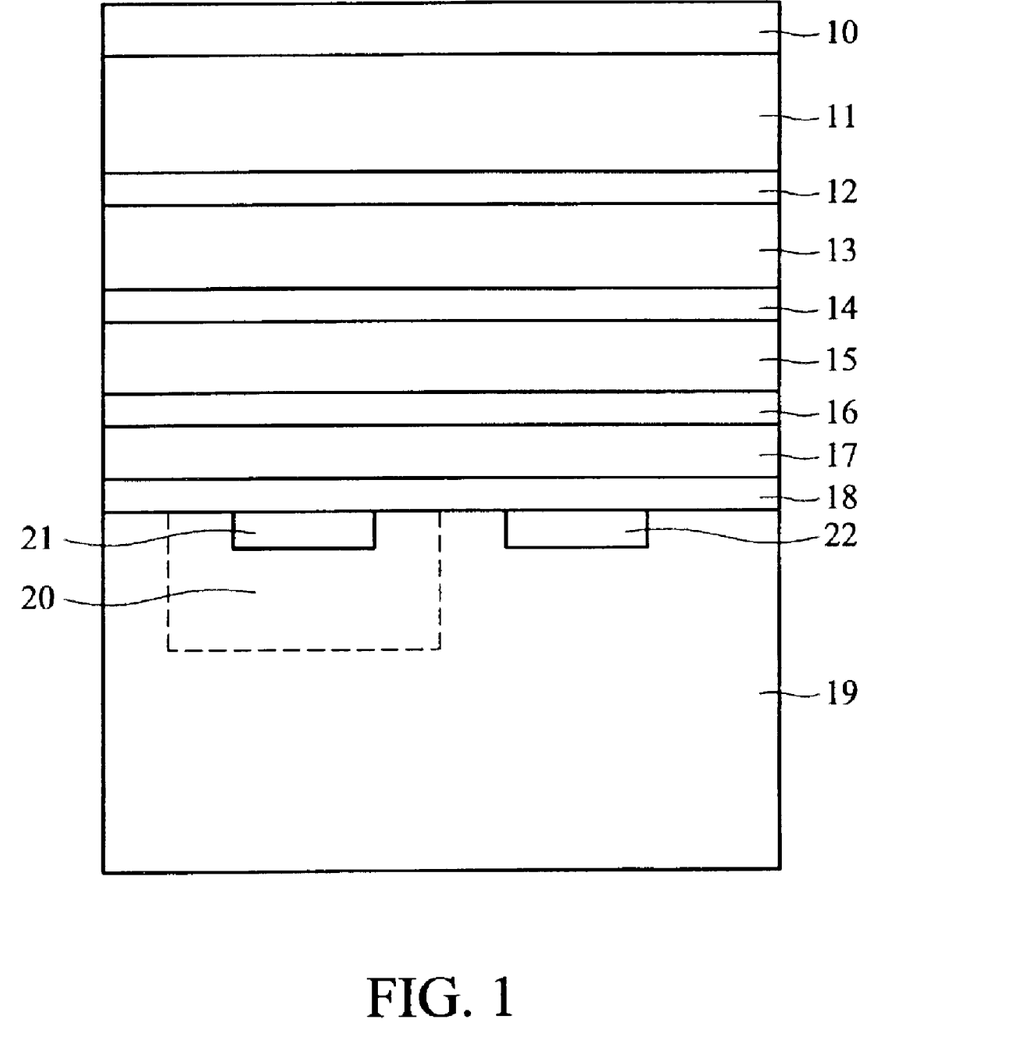
FIG. 1 is a cross-section of a laminated structure used in a chip layout according to the present invention.

FIG. 1 shows cross-sectional layers fabricated by the standard 0.5 $\mu$m complementary metal oxide semiconductor integrated circuit (CMOS IC), Double Poly Double Metal (DPDM), n-well process, In FIG. 1, in addition to the deposition and metal layers produced by the standard CMOS IC process, a temperature sensor (20, 21) and a photo-sensor (19, 22) are also produced by the doping step of the standard process. As shown in FIG. 1, the layers are characterized as below: passivation layer 10 with 0.7 μm thick; metal layer 11 with 1.1 μm thick; oxide layer 12 with 0.5 μm thick; metal layer 13 with 0.6; oxide layer 14 with 0.5 μm thick; gate poly-Si layer 15 with 0.3 μm thick; gate oxide layer 16 with 135 Å thick; capacitance poly-Si layer 17 with 0.2 μm thick; field-oxide layer 18 with 0.5 μm thick; the N-type metal oxide semiconductor (NMOS), which is included in an extended gate field effect transistor (EGFET) over a silicon substrate 19, with aspect width/length (W/L) of 600 μm/20 μm, sensitive window of 300 μm×300 μm, temperature diode formed by the P-type diffusion 21 to N-well 20, photodiode formed by the N-type diffusion 22 to P-type substrate 19; and the inventive chip with a total area of 1.8 mm×1.8 mm.

Figure 2:
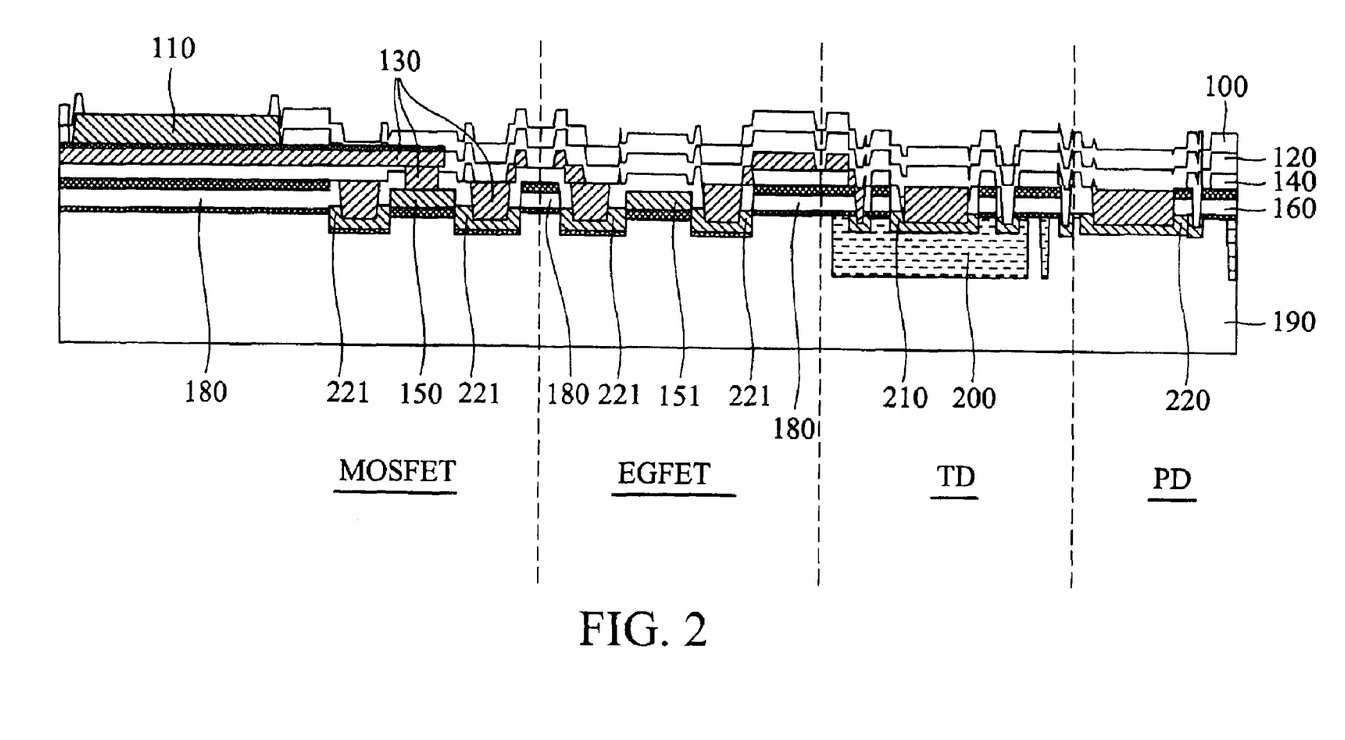
FIG. 2 is a cross-section of the whole chip structure according to the present invention.

FIG. 2 is a whole cross-section of the whole chip structure according to the present invention. In FIG. 2, the structure includes an EGFET; a metal oxide semiconductor field effect transistor (MOSFET), a temperature diode TD and a photodiode PD. As shown in FIG. 2, the chip includes an ion sensitive field effect transistor (ISFET), formed by an N-type diffusion 221 (applying the N-type diffusion 22 of FIG. 1) and a middle gate 150 (applying the gate poly-Si layer 15 of FIG. 1), with extended structure 130 (applying the metal layer 13 of FIG. 1), using the standard IC process. Additionally, the ISFET with extended structure 150 has an open sensitive window coated with $SnO_2$ thin film 110 (applying the metal 110 of FIG. 1) using a sputtering machine to produce required sensitive means and the sensitivity of which is 58 mV/pH in a concentration range between pH 2 and pH 10, which is very close to ideal Nernst response that shows a linear pH sensitive curve. The temperature sensor TD is a diode formed by the P-type diffusion 210 (applying the P-type diffusion 21 of FIG. 1) to N-well 200 (applying the N-well 20 of FIG. 1) and operated in reverse bias voltage. The sensor TD has a sensitivity of −1.83 mV/° C., which has high reliability and linearity. The photo-sensor PD is a diode formed by the N-type diffusion 220 (applying the N-type diffusion 22 of FIG. 1) to P-type substrate 190 (applying the P-type substrate 19 of FIG. 1) and operated in forward bias voltage. The sensor PD has a fast response and a sensitivity of −92.66 μV/lux using a 234 k feedback resistor. The inventive readout circuit is also fabricated by the standard CMOS IC process to layout in the MOSFET (not shown). A field-oxide 180 (applying the field-oxide 18 of FIG. 1) is layered between the devices for electrical isolation.

Figure 3:
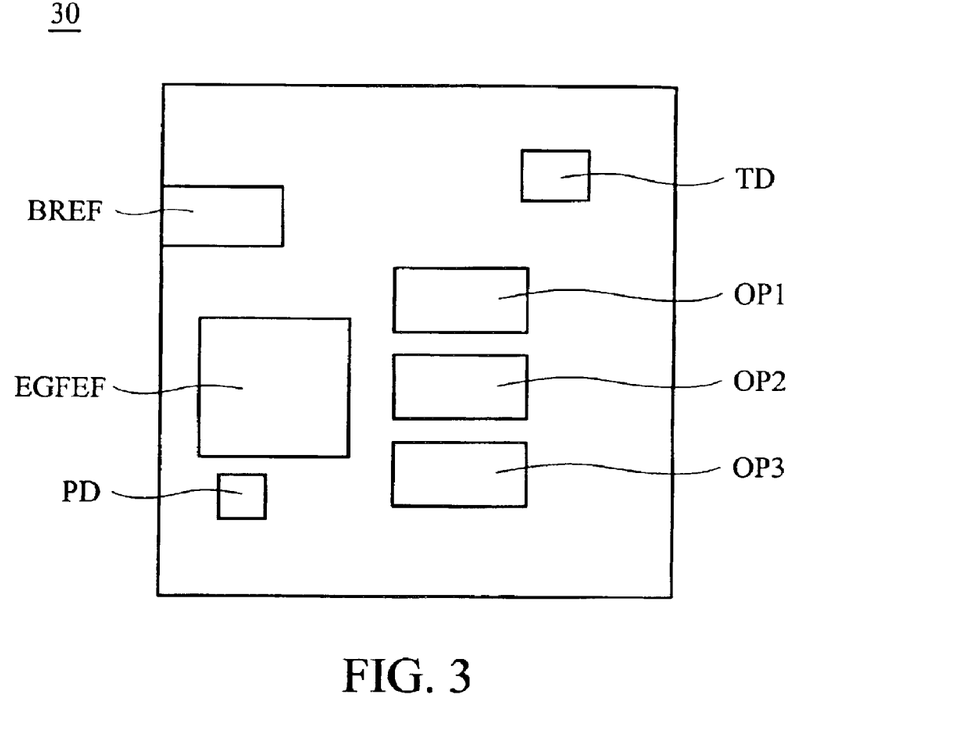
FIG. 3 is a layout diagram of the summation chip according to the present invention.

FIG. 3 is a layout of the chip 30 according to the invention. As shown in FIG. 3, when the above-cited process is applied to layout the devices to the chip 30 in an area of 1.8 mm×1.8 mm, the invention has features of easy manufacture, no additional photomask required by the back-end process and adaptive standard CMOS IC process (such as UMC or TSMC). In the back-end process, only an $SnO_2$ sensitive membrane is coated on the gate window to produce required sensitive means. The devices of EGFET, TD, PD and integrated readout circuit are described in detailed as below, wherein the readout circuit includes amplifiers OP1-OP3, a bandgap reference circuit BREF.

Figure 4:
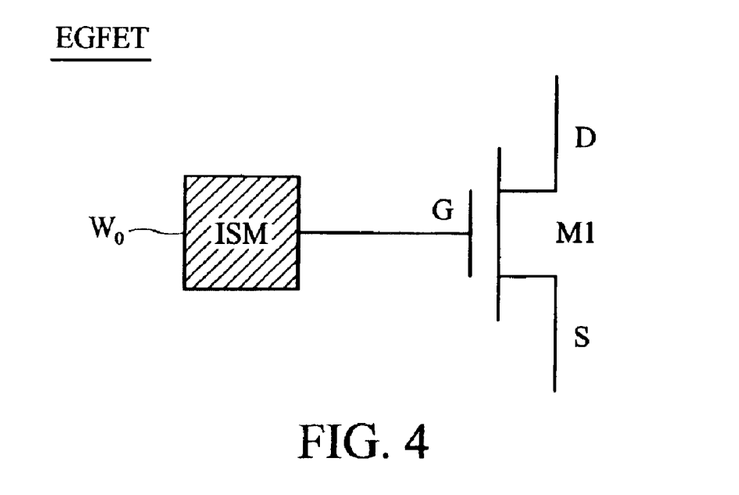
FIG. 4 is a schematic diagram of an extended gate field effect transistor (EGFET) circuit of FIG. 2 according to the present invention.

FIG. 4 is a schematic diagram of the EGFET circuit of FIG. 2. In FIG. 4, the EGFET circuit includes an extended gate $SnO_2$/Al multi-layer electrode sensor that consisting of an open window Wo and a transistor M1 as shown in FIG. 4, the configuration produces a linear dependence between the ion sensitive membrane potential and the output voltage.

Figure 5:
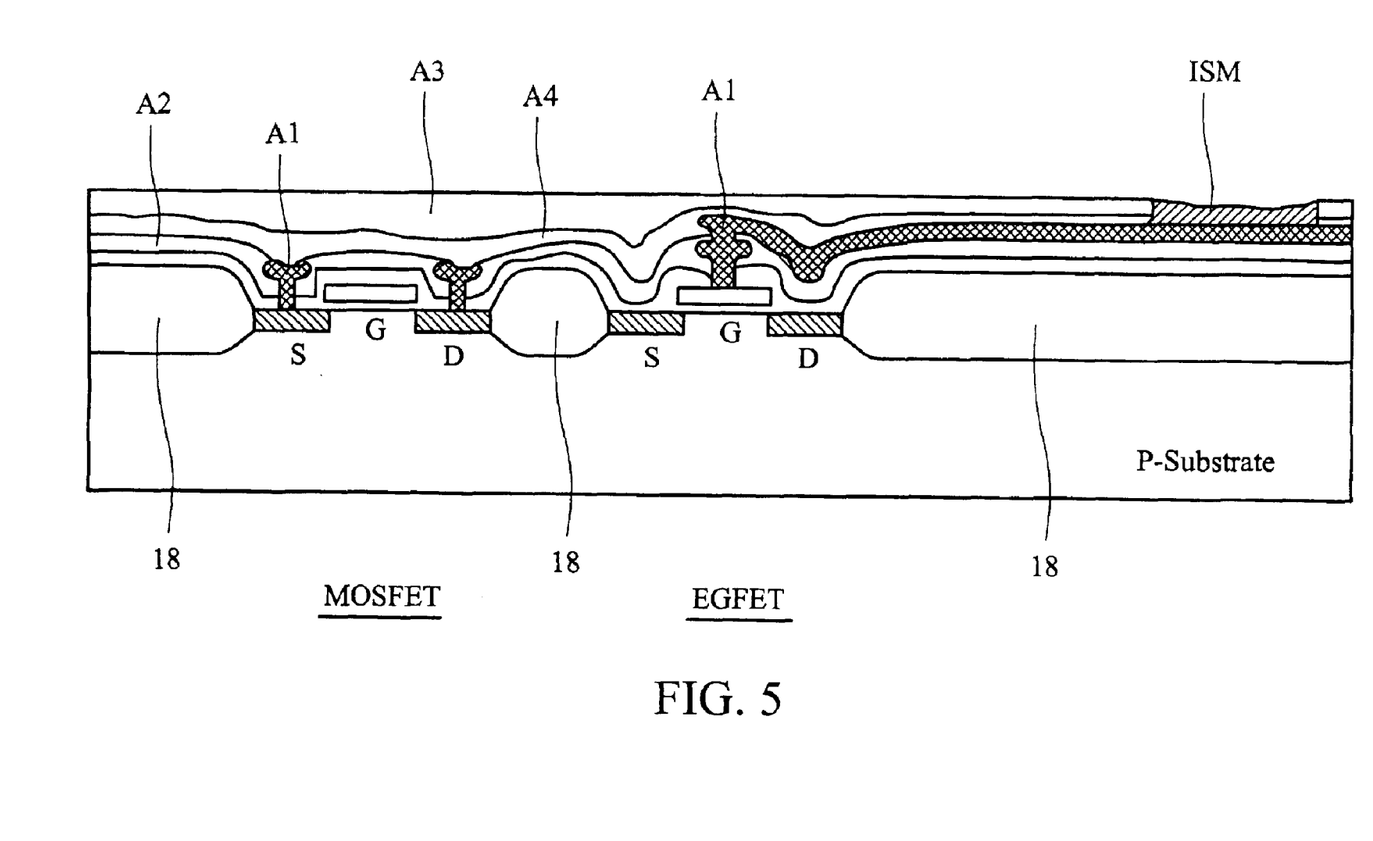
FIG. 5 is a schematic cross-section of the circuit of FIG. 4 according to the present invention.

FIG. 5 is a cross-section of the circuit of FIG. 4. In FIG. 5, the right cross-section is an EGFET layout and the left cross-section is an MOSFET layout. As shown in FIG. 5, using the standard N-well poly-Si gate semiconductor process with accordance to the structure provided by FIGS. 1 and 2 layouts the EGFET and MOSFET devices over a P-type substrate, wherein an $SiO_2$ field-oxide oxide layer 18 is located between two adjacent devices. Next, using A1 metal A1, the gate G of the EGFET is extended to the position of the sensitive window. A layer of glass A4 is an electrical insulator over the A1 metal except for the sensitive window. Finally, the sensitive window is coated on a layer of $SnO_2$ sensitive membrane ISM to complete the structure. Because the readout circuit (described later) layout is integrated into the SiN passivation layer of the MOSFET (not shown) and the entire structure is encapsulated with epoxy resin A3 except for the sensitive window where provides electrical connection to the external, the readout circuit is not affected by any external factor. Because an NMOSFET has higher mobility than a PMOSFET, the NMOSFET is preferred for the MOSFET.

Figure 6:
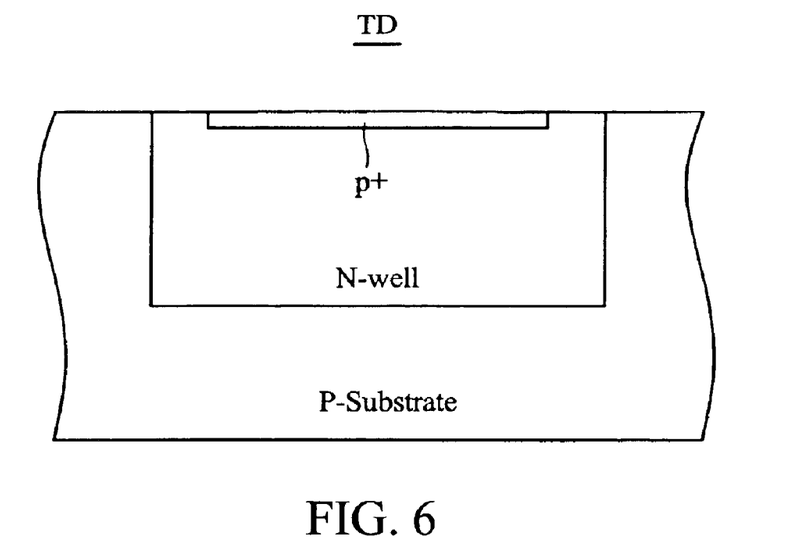
FIG. 6 is a schematic cross-section of a temperature diode of FIG. 2 according to the present invention.

FIG. 6 is a cross-section of the temperature sensor TD of FIG. 2. As shown in FIG. 6, the sensor PD is fabricated by the standard semiconductor process to dope P-type ions to the N-well in the P-type substrate and thus produce the diffusion region $p^+$ to further form a diode structure with $p^+$-N well. The formed diode is active as the desired temperature sensor TD because the active voltage will reduce with increasing temperature in forward bias voltage.

Figure 7:
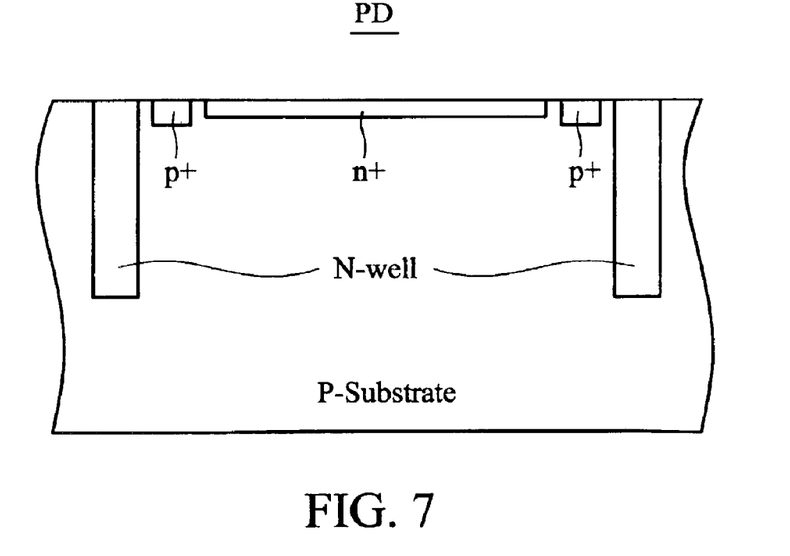
FIG. 7 is a schematic cross-section of a photodiode of FIG. 2 according to the present invention.

FIG. 7 is a cross-section of the photodiode PD of FIG. 2. As shown in FIG. 7, the sensor PD is fabricated by the standard semiconductor process to dope N-type ion to a region between two N-wells in the P-type substrate and thus produce the diffusion region $n^+$ to further form a diode structure with $n^+$-P substrate. The formed diode is active as the photo-sensor PD because the active current caused by charge density will change with photo-intensity change.

Figure 8:
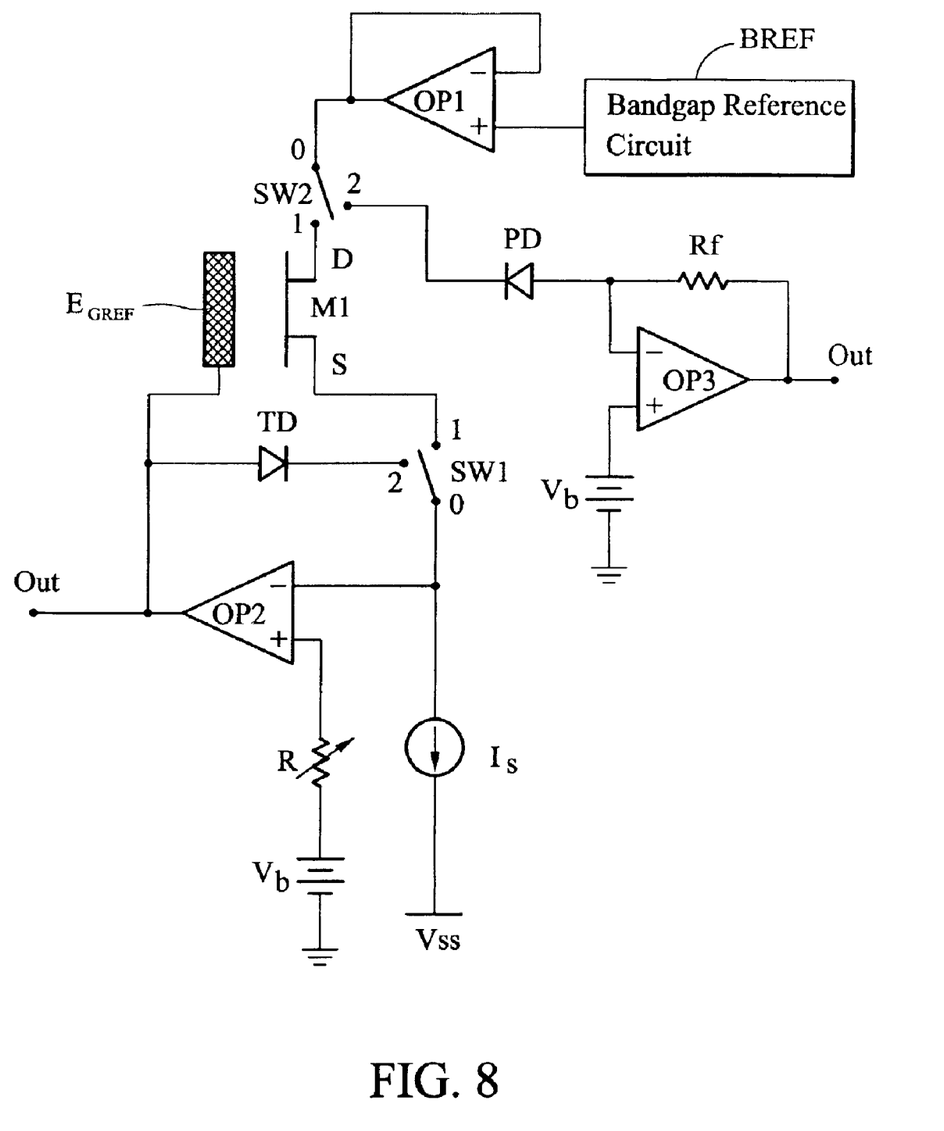
FIG. 8 is a schematic diagram of a readout circuit of the chip according to the present invention.

FIG. 8 is a schematic diagram of the readout circuit. In FIG. 8, the readout circuit includes two switches SW1, SW2, three amplifiers OP1–OP3, a constant current source Is, a bias voltage, a variable resistor R, a gain resistor Rf, an ion sensor M1, a temperature sensor TD, a photo-sensor PD, and an output terminal Out. As shown in FIG. 8, the readout circuit sequentially reads a pH signal from the pH sensor M1, a temperature signal from the temperature sensor TD, and a photo-intensity signal from the photo-sensor PD within a clock cycle through the SW1 and SW2 control. When the switch is on position 1, the output terminal Out outputs the pH signal. When the switch is on position 2, the output terminal Out outputs the temperature signal first and the photo-intensity signal later. Accordingly, the above operation is repeated and so all sensitive values from the sensors are read out. This requires only 60% of original area for a conventional layout and further increase cost efficiency. The sensors are now described as below.

Figure 9:
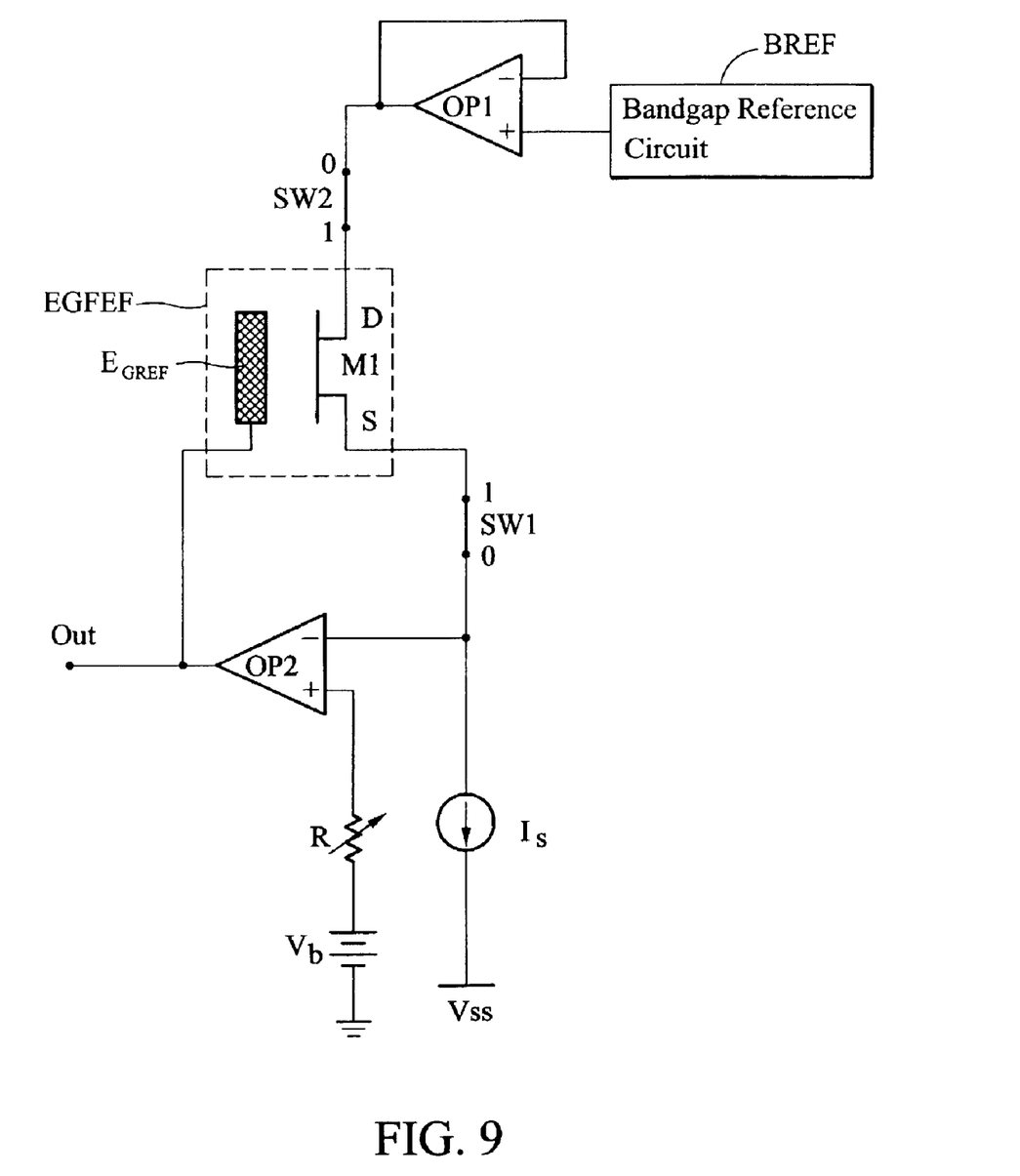
FIG. 9 is a diagram of partial readout circuit of the pH sensor of FIG. 8 according to the present invention.

FIG. 9 is the readout circuit for the pH sensor of FIG. 8. As shown in FIG. 9, the pH sensor is shown as the switches SW1 and SW2 are on position 1. The readout circuit for the pH sensor is constant current constant voltage configuration. Inside the readout circuit, the amplifier OP1 provides a stable voltage to the EGFET M1 through the input of a bandgap reference circuit BREF to obtain a sensing voltage $V_{DS}$ between the drain D to source S of M1. Next, the amplifier OP2 provides a stable current, equal to a sensing current $I_{DS}$ between the drain D to source S of M1, to the pH sensor M1. The current $I_{DS}$ with respect to the voltage $V_{DS}$ forms a feedback of voltage between the gate $E_{GREF}$ to source S and thus the output of the current $I_{DS}$ is changed with the pH change of the solution used. Therefore, the pH value is detected by the extended gate $E_{GREF}$. After the readout circuit for the pH sensor is configured, the amplifier OP1 has a positive input terminal, a negative input terminal and an output terminal. The positive input terminal is connected to an external bandgap reference circuit BREF to provide the stable voltage. The negative input terminal is connected to a control terminal 0 of a second selective switch SW2 and the output terminal. The amplifier OP2 has a positive input terminal, a negative input terminal and an output terminal. The positive input terminal is connected to a reference bias circuit. The negative input terminal is connected to a control terminal 0 of a first selective switch SW1 and a constant current Is connected to an external negative voltage source Vss. The output terminal is connected to an external output terminal Out. The pH sensor M1 has the gate $E_{GREF}$, the drain D and the source S. The gate $E_{GREF}$ is connected to the output terminal of the amplifier OP2, the source S is connected to a first selective terminal 1 of the first switch SW1 and the drain D is connected to a first selective terminal 1 of the second switch SW2. As such, the readout circuit configuration with constant current constant voltage implementation is complete.

Figure 10:
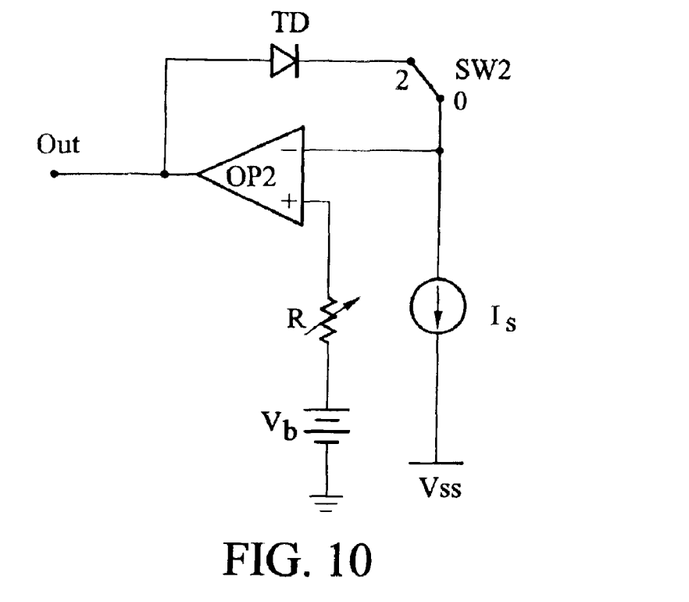
FIG. 10 is a diagram of partial readout circuit of the temperature diode of FIG. 8 according to the present invention.

FIG. 10 is the readout circuit for the temperature sensor of FIG. 8. As shown in FIG. 10, the temperature sensor is shown as the switches SW1 and SW2 are on position 2. The amplifier OP2 modulates the temperature diode to obtain a constant current using a connected constant current Is of the negative voltage source Vss and reference of the variable resistor. Thus, the sensing output will vary with temperature changes as the active voltage varies with different temperature. Accordingly, the purpose of temperature detection is achieved, After the readout circuit for the temperature sensor is configured, the amplifier OP2 has the configuration as cited above. The anode of the sensor TD is connected to the output terminal of the amplifier OP2 and the cathode is connected to a second selective terminal 2 of the SW1, to complete the readout circuit for temperature sensor implementation. The reference bias circuit consists of a cascade variable resistor R and grounding bias source Vb.

Figure 11:
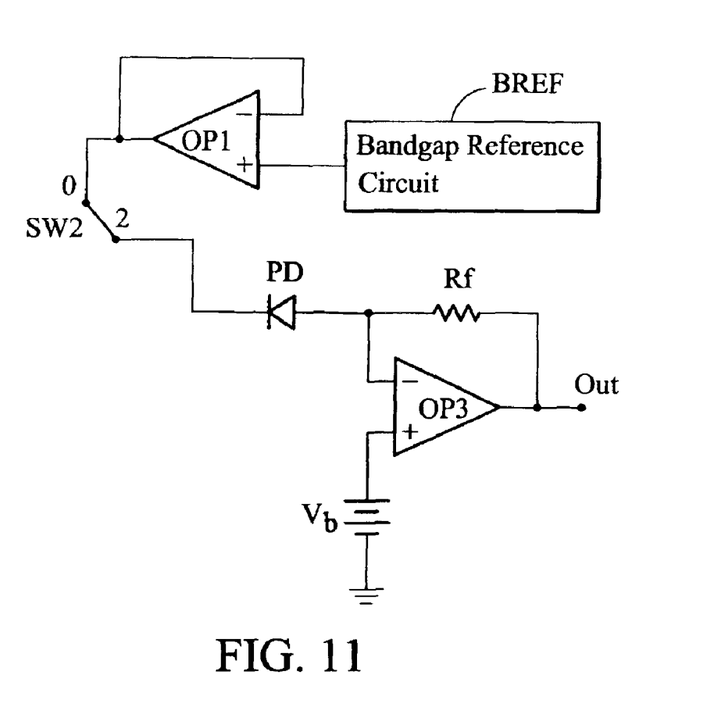
FIG. 11 is a diagram of partial readout circuit of the photodiode of FIG. 8 according to the present invention.

FIG. 11 is the readout circuit for the photo-sensor of FIG. 8. As shown in FIG. 11, the photo-sensor is shown as the switches SW1 and SW2 are on position 2. The amplifier OP1 provides photodiodes a stable voltage as an operating voltage. The amplifier OP3 applies a feedback to the photo-current of the photodiodes to produce a voltage output and complete photo-intensity detection. In the configuration of readout circuit for the photo-sensor, the amplifier OP1 is configured as the above. The amplifier OP3 has a positive terminal, a negative terminal and an output terminal such that the positive terminal is connected to the grounding bias source Vb of the amplifier OP1, the negative terminal is connected to the anode of the photo-sensor PD and an end of a feedback resistor Rf, and the output terminal is connected to another end of the feedback resistor Rf and the external output terminal Out of the amplifier OP1 at the same aide. As well, the cathode of the photo-sensor is connected to a second selective terminal 2 of the second selective switch SW2 to complete the readout circuit of the photo-sensor.

Figure 12:
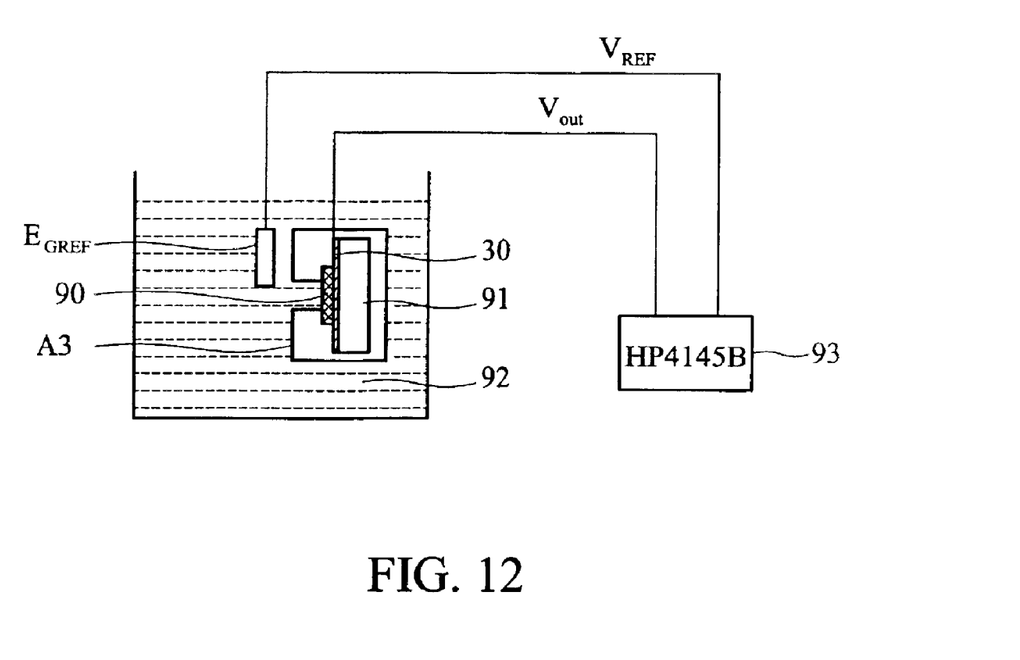
FIG. 12 is a schematic diagram of a measurement configuration according to the present invention.

FIG. 12 is a schematic diagram of a measurement configuration able to read the desired sensing values according to the present invention. As shown in FIG. 12, the chip 30 on a ceramic base 91 is encapsulated with epoxy resin Epo to provide electrical insulation for the bonding wires and exposed silicon regions of the chip 30. Next, the encapsulated chip 30 is immersed in a buffer solution 92 by 1 minute in order to measure and analyze the sensors of the chip 30 through the sensitive window 90 with $SnO_2$ membrane later.

In practice, the HP4145B semiconductor parameter analyzer 93 was used to obtain the sensing values of the sensors through the integrated readout circuit via the membrane 90 and refer to the voltage of the reference electrode EGREF to generate corresponding output Vout.

Figure 13:
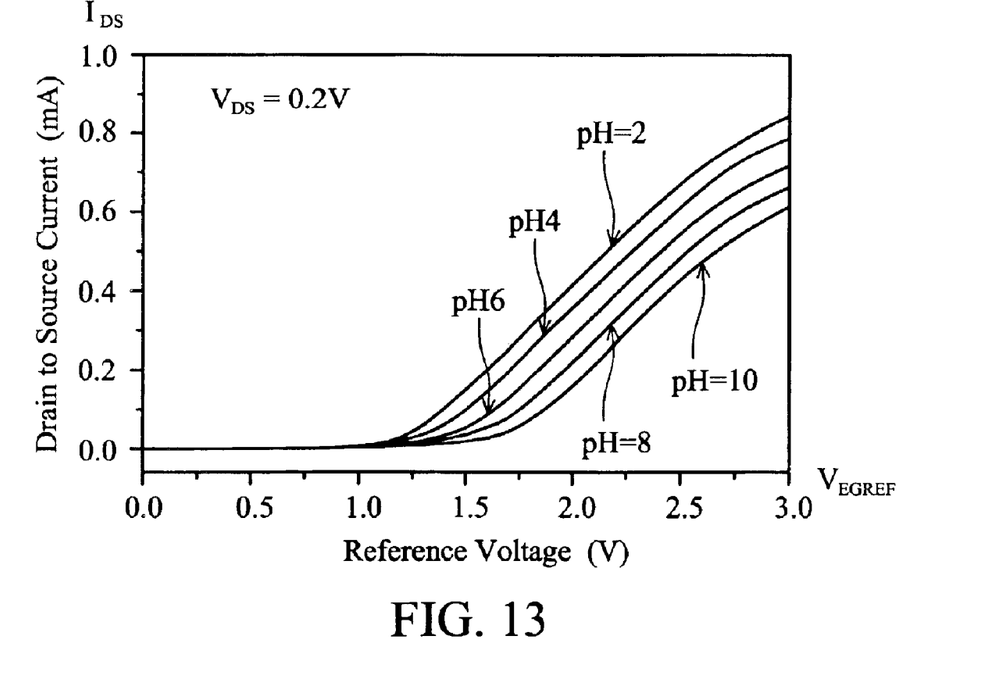
FIG. 13 is curves of the sensing current-reference voltage ($I_{DS}$-$V_{EGREF}$) under the different pH buffer solutions for the EGFET pH sensor of FIG. 12.

FIG. 13 is curves of the sensing current-reference voltage ($I_{DS}$-$V_{EGREF}$) under the different pH buffer solutions for the EGFET pH sensor of FIG. 12. In FIG. 13, the lateral axis is the reference voltage $V_{EGREF}$ of reference electrode and the vertical axis is the sensing current $I_{DS}$ of pH sensor. When the EGFET and an Ag/AgCl reference electrode are immersed in the pH 2, 4, 6, 8, 10 buffer solutions 92 by 1 minute at room temperature and then performs the measurement operating conditions, a family of curves can be generated by applying the drain-source voltage $V_{DS}$=0.2V for the reference voltage $V_{EGREF}$. As shown in FIG. 13, the resulting pH values of the solution 92 and the reference voltage $V_{EGREF}$ are negative proportional to the current $I_{DS}$. That is to say that the pH value is smaller as the current $I_{DS}$ measured is higher. Therefore, the sensing purpose is achieved by means of the transfer characteristics of the sensing current $I_{DS}$ output with significant changes at various pH buffer solutions.

Figure 14:
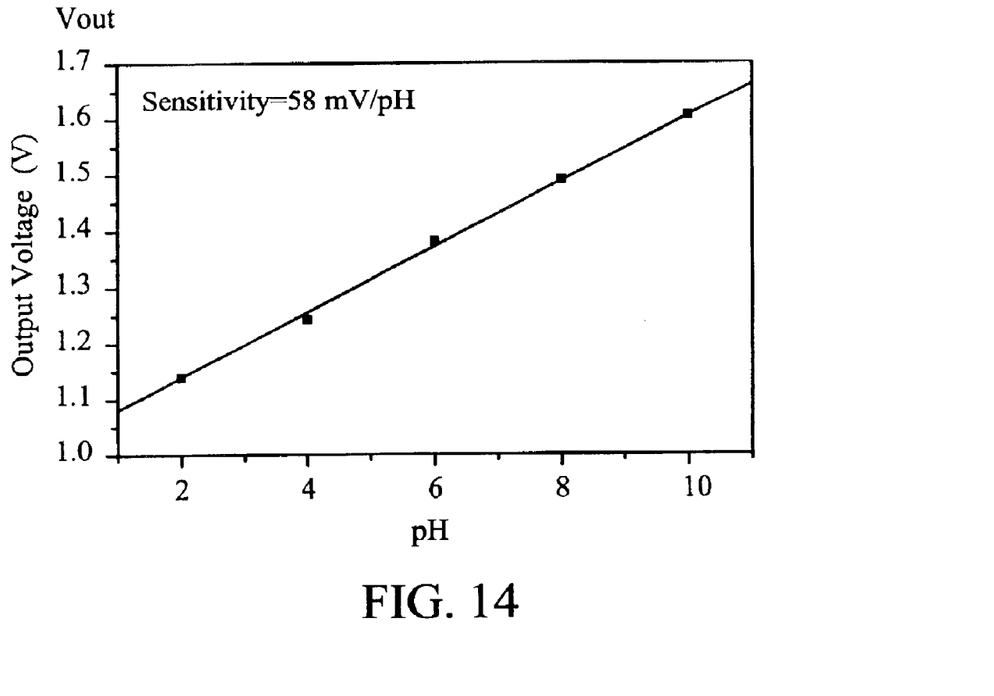
FIG. 14 is a curve of the output voltage-pH (Vout-pH) of FIG. 13 according to the present invention.

FIG. 14 is a curve of the output voltage-pH (Vout-pH) of FIG. 13 according to the present invention. As shown in FIG. 14, the output voltages Vout and the pH values have a positive linear relation. As aforementioned, the sensitive configuration of FIG. 12 can generate a linear relationship between the potential of $SnO_2$ membrane Metal2 and the output voltage. In this case, the $SnO_2$/Al extended gate $E_{GREF}$ of pH sensor M1 has a linear pH sensitivity of approximately 58 mV/pH after analysis.

Figure 15:
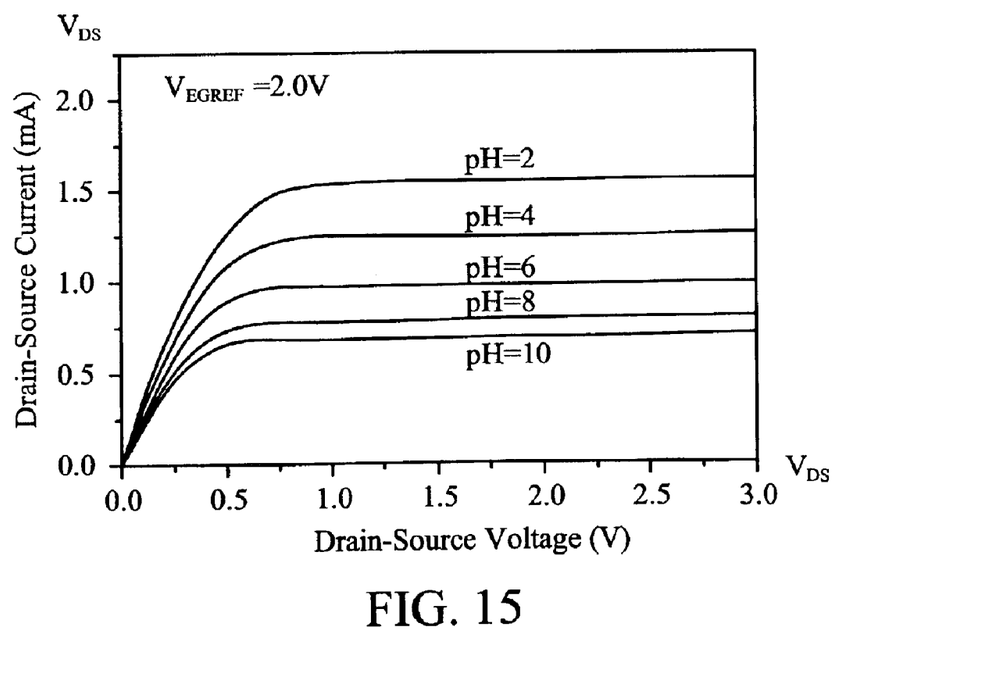
FIG. 15 is curves of the sensing current-voltage ($I_{DS}$-$V_{DS}$) under the different pH buffer solutions for the EGFET pH sensor of FIG. 12.

FIG. 15 is curves of the sensing current-voltage ($I_{DS}$-$V_{DS}$) under the different pH buffer solutions for the EGFET pH sensor of FIG. 12. As shown in FIG. 15, when such a pH sensor is placed in different pH buffer solutions, the change between the drain-source current $I_{DS}$ and voltage $V_{DS}$ under the different pH buffer solutions is analyzed and found that drain-source current varies with the turn-on voltage of pH buffer solution. In this case, for applying the reference electrode voltage $V_{EGREF}$=2.0 V in operation, the drain-source voltage $V_{DS}$ is varied from 0 to 3 V, and so the device is operated in saturation region. It is clearly shown in the figure that the current $I_{DS}$ changes as a function of square root.

Figure 16:
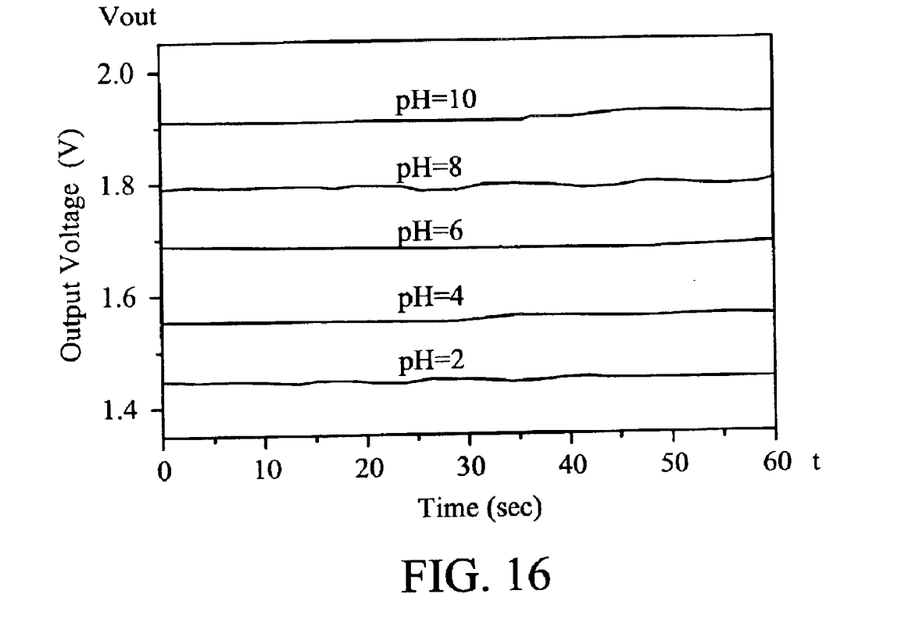
FIG. 16 is a curve of the output voltages of the pH sensor of FIG. 12 at the different time.

FIG. 16 is a curve of the output voltages Vout of the pH sensor of FIG. 12 at the different time t. After the pH sensor is connected to its readout circuit through the switches as shown in FIG. 12, the measurement for the pH values is performed respectively in the pH 2, 4, 6, 8, 10 buffer solutions and the outputs are shown in FIG. 16. In the figure, the vertical axis is output voltage Vout and the lateral axis is time t. It is clearly shown that the output changes have a linear pH sensitivity of approximately 58 mV/pH under different measurement time and pH buffer solutions.

Figure 17:
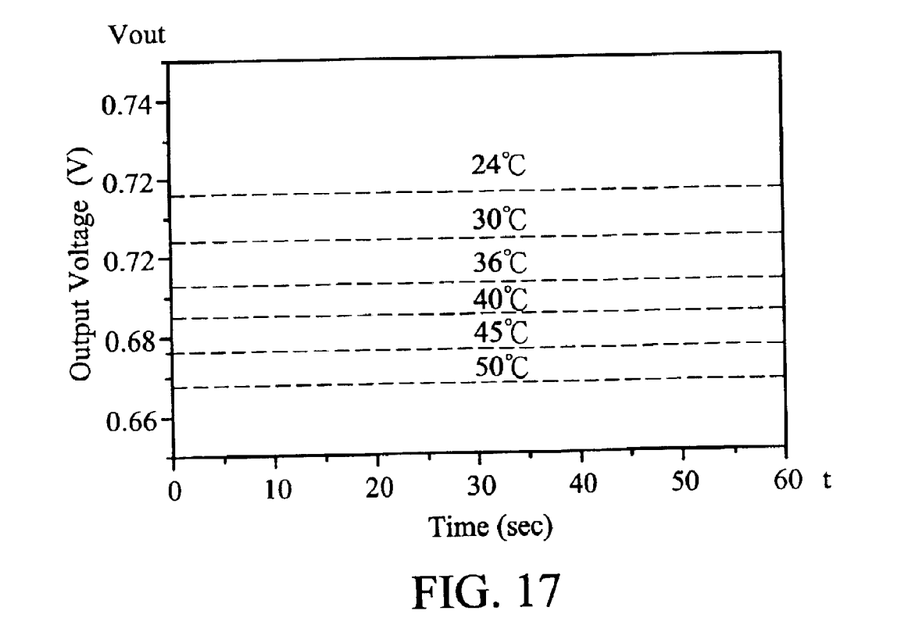
FIG. 17 is a curve of the output voltages of the temperature sensor of FIG. 12 at the different time.

FIG. 17 is a curve of the output voltages of the temperature sensor of FIG. 12 at the different time. After the temperature sensor, here a p-n diode with standard CMOS IC process, is connected to its readout circuit through the switches as shown in FIG. 12, the measurement for the temperature values is performed respectively at 24° C., 30° C., 36° C., 40° C., 45° C., 50° C. and the outputs are shown in FIG. 17. In the figure, the vertical axis is output voltage Vout, the lateral axis is time t and the measurement time is about 1 minute. It is clearly shown that the outputs are very stable and present linear.

Figure 18:
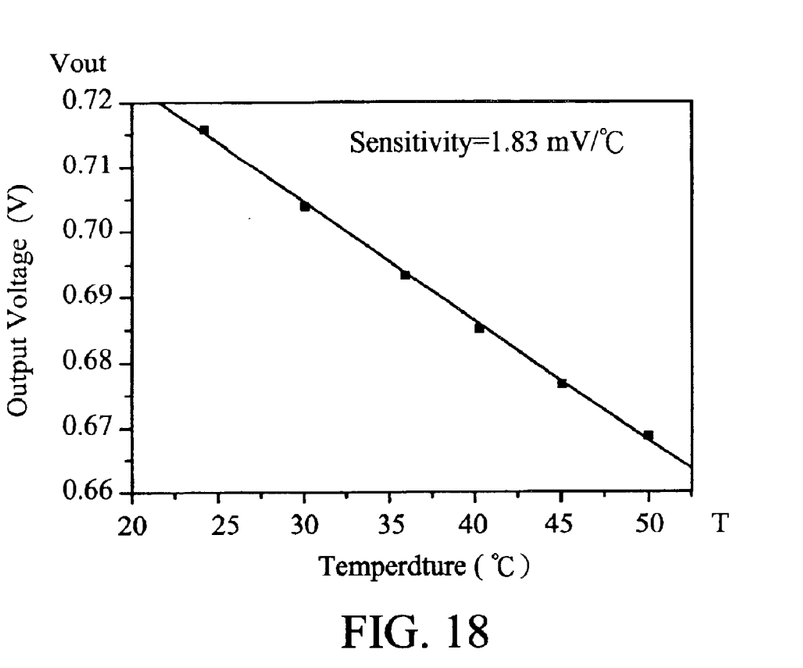
FIG. 18 is a curve of the output voltage-temperature (Vout-T) of FIG. 17 according to the invention.

FIG. 18 is a curve of the output voltage-temperature (Vout-T) of FIG. 17 according to the invention. As shown in FIG. 18, after the sensitivity analysis, the output curve clearly presents a highly linear sensitivity of approximately −1.83 mV/° C.

Figure 19:
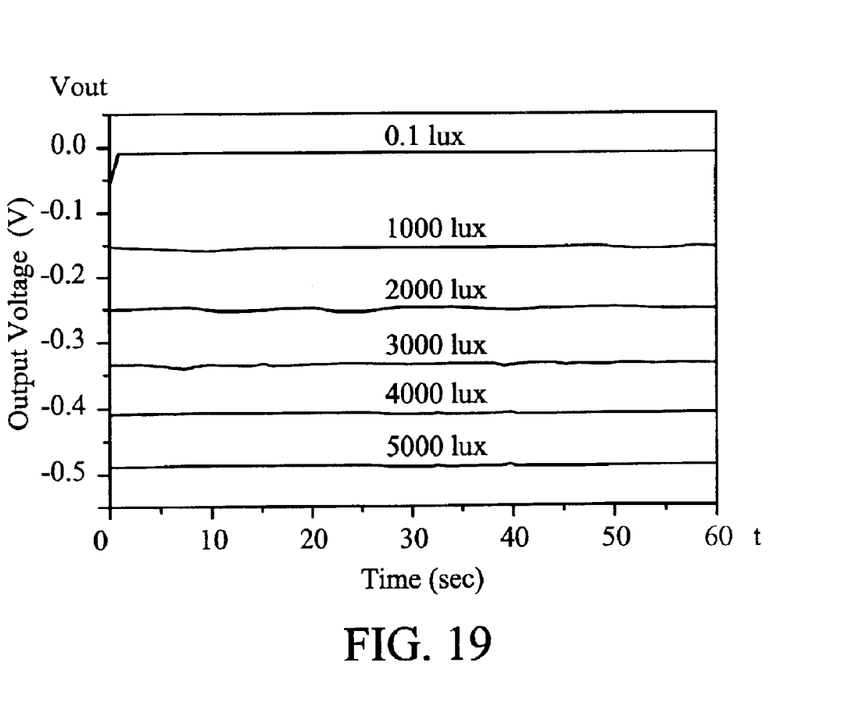
FIG. 19 is a curve of the output voltages of the photo-sensor of FIG. 12 at the different time.

FIG. 19 is a curve of the output voltages of the photosensor of FIG. 12 at the different time. After the photo-sensor, here a photodiode with standard CMOS IC process, is connected to its readout circuit through the switches as shown in FIG. 12, the measurement for the photo-intensity values is performed respectively at 0 lux, 1000 lux, 2000 lux, 3000 lux, 4000 lux, 5000 lux, and the outputs are shown in FIG. 19. In the figure, the vertical axis is output voltage Vout, the lateral axis is time t and the measurement time is about 1 minute. It is clearly shown that the outputs are very stable and present linear.

Figure 20:
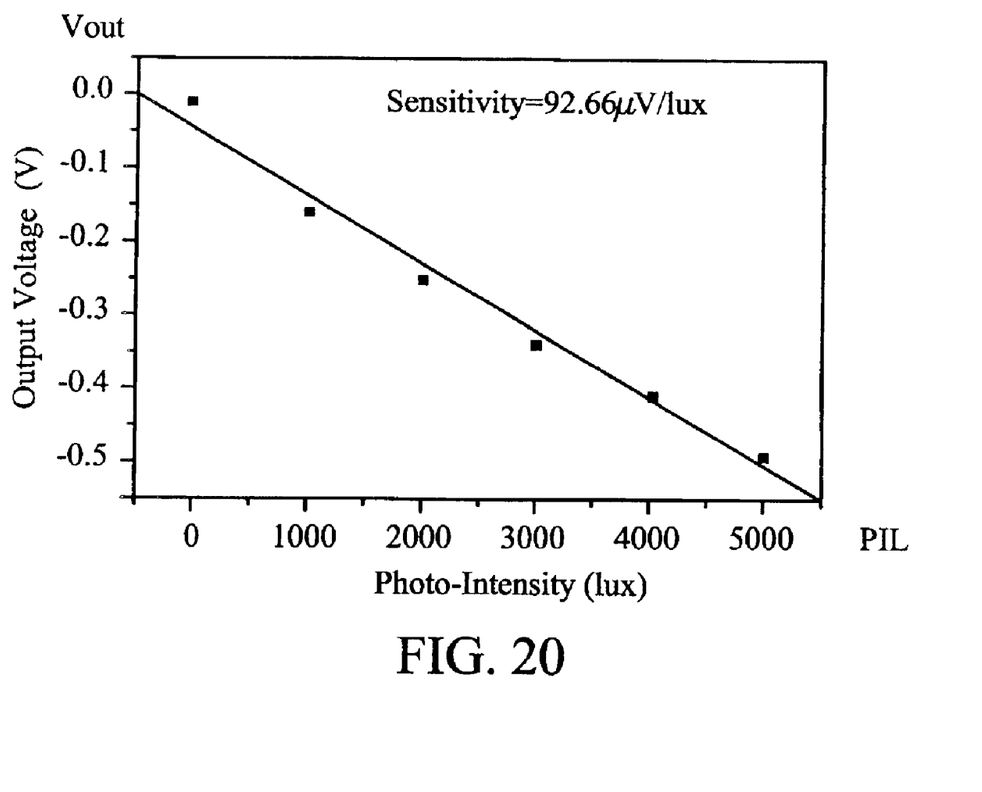
FIG. 20 is a curve of the output voltage to photo-intensity (Vout-PIL) of FIG. 19 according to the invention.

FIG. 20 is a curve of the output voltage to photo-intensity (Vout-PIL) of FIG. 19 according to the invention. As shown in FIG. 20, when a 234 Ω feedback resistor Rf is applied to the sensitivity analysis for the output voltage to photo-intensity relation in FIG. 19, the output curve presents a highly linear sensitivity of approximately −92.66 $\mu$V/C.

As cited, all sensors (including the pH, temperature, and photo-intensity sensors) and corresponding readout circuits are fabricated in a single chip using the standard CMOS IC process, and the entire area used by the chip is only about 1.8 mm×1.8 mm including wiring points. Therefore, the inventive chip is suitable for mass-production due to the features of low cost and small physical body. The integrated chip can additionally provide the compensation for the temperature and optical effects and output desired precise pH sensing value.

The invention can also be applied to other fields. For example, the cited readout circuit can convert biochemical signal and physical signal respectively to an electrical signal to be output to measure the pH value of environment water for pollution monitors desired by some industries and for pH reaction controls desired by bio-industries.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a monolithic chip including multi-sensors that can detect pH, temperature, photo-intensity simultaneously and a readout circuit, comprising the steps:

forming an ion sensitive field effect transistor (ISFET) with an extended gate sensitive window and coating an $SnO_2$ sensitive membrane on the window using sputtering process, so as to form an extended gate field effect transistor (EGFET) as an ion sensitive sensor (pH sensor);

forming a metal oxide semiconductor field effect transistor (MOSFET), wherein an integrated readout circuit with selective switches are implemented to sequentially output values sensed by the multi-sensors;

layouting an N-type well over a P-type substrate and then a p-diffusion region within the N-type well using ion implanting process to form a temperature diode consisting of the p-diffusion region with respect to the N-type well, such that the temperature diode acts as a temperature sensor to sense temperature in forward bias voltage; and forming an n-diffusion region within the P-type substrate using the ion implanting process, such that a photodiode consisting of the n-diffusion region with respect to the P-type substrate is produced and acts as a photo-sensor to sense photo-intensity in reverse bias voltage.

2. The method of claim 1, wherein the integrated readout circuit with selective switches is formed by using the selective switches to connect a readout circuit for the pH sensor with constant current constant voltage configuration, a readout circuit for the temperature sensor and a readout circuit for the photo-sensor together, wherein, the readout circuit for the temperature sensor has the temperature sensor with an anode and a cathode, and a second amplifier with a positive input terminal, a negative input terminal and an output terminal, such that the positive input terminal is connected to a reference bias circuit, the negative input terminal is connected to a constant current connected to an external negative voltage source and a control terminal of a first selective switch, the output terminal is connected to the anode of the temperature sensor and an external output terminal, and the first selective switch has a second selective terminal connected to the cathode of the temperature sensor, thereby completing the readout circuit for the temperature;

the readout circuit for the pH sensor has the pH sensor with a gate, a source and a drain, the second amplifier and a first amplifier with a positive input terminal, a negative input terminal and an output terminal, such that the gate of the pH sensor is connected to the output terminal of the second amplifier, the drain is connected to a first selective terminal of the first selective switch and the source is connected to a first selective terminal of a second selective switch, a control terminal of the second selective switch is connected to the negative input terminal and the output terminals of the first amplifier, and the positive input terminal of the first amplifier is connected to an external bandgap reference circuit, thereby completing the readout circuit for the pH sensor with constant current constant voltage configuration; and the readout circuit for the photo-sensor has the photo-sensor with an anode and a cathode, a third amplifier with a positive input terminal, a negative input terminal and an output terminal, and a feedback resistor, such that the positive input terminal of the third amplifier is connected to a grounding bias source, the negative input terminal is connected to the anode of the photo-sensor and one terminal of the feedback resistor, the output terminal is connected to the other terminal of the feedback resistor and the external output terminal, and the cathode of the photo-sensor is connected to a second selective terminal of the second selective switch, thereby completing the readout circuit for the photo-sensor.

3. The method of claim 2, wherein the reference bias circuit is formed by a variable resistor connected in series to the grounding bias source.

4. The method of claim 2, wherein the gate of the pH sensor is referred to as a reference electrode of the pH sensor.

5. The method of claim 1, wherein the integrated readout circuit with selective switches reads output values of the pH sensor, the temperature sensor, and the photo-sensor in turn within a clock cycle through the extended gate sensitive window.

6. The method of claim 1, wherein the temperature sensor uses the feature that a turn-on voltage becomes smaller with the temperature higher in forward bias voltage and accordingly senses the temperature change.

7. The method of claim 1, wherein the photo-sensor uses the feature that a current caused by charge change is varied with the degree of photo-intensity in reverse bias voltage and accordingly senses the photo-intensity change.

* * * * *